United States Patent
Saito et al.

(10) Patent No.: US 8,860,090 B2
(45) Date of Patent: Oct. 14, 2014

(54) NITRIDE SEMICONDUCTOR DEVICE

(75) Inventors: Wataru Saito, Kanagawa-ken (JP); Yasunobu Saito, Tokyo (JP); Hidetoshi Fujimoto, Kanagawa-ken (JP); Akira Yoshioka, Kanagawa-ken (JP); Tetsuya Ohno, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 157 days.

(21) Appl. No.: 13/420,559

(22) Filed: Mar. 14, 2012

(65) Prior Publication Data

US 2013/0062671 A1 Mar. 14, 2013

(30) Foreign Application Priority Data

Sep. 12, 2011 (JP) ................................. 2011-198301

(51) Int. Cl.
*H01L 29/778* (2006.01)
*H01L 29/10* (2006.01)
*H01L 29/423* (2006.01)

(52) U.S. Cl.
CPC ........ *H01L 29/7786* (2013.01); *H01L 29/1075* (2013.01); *H01L 29/1066* (2013.01); *H01L 29/4236* (2013.01); *H01L 29/7783* (2013.01); *H01L 29/1087* (2013.01)
USPC ................................. 257/195; 257/E29.249

(58) Field of Classification Search
CPC ..................... H01L 29/2003; H01L 29/42316; H01L 29/812; H01L 29/778; H01L 29/7787; H01L 29/7783; H01L 29/1075
USPC ................... 257/194, 195, E29.249
See application file for complete search history.

(56) References Cited

U.S. PATENT DOCUMENTS

| | | | |
|---|---|---|---|
| 6,849,880 B1 | 2/2005 | Saito et al. | |
| 7,075,125 B2 | 7/2006 | Saito et al. | |
| 7,538,366 B2 | 5/2009 | Saito et al. | |
| 2004/0124435 A1* | 7/2004 | D'Evelyn et al. | 257/103 |
| 2007/0228401 A1 | 10/2007 | Machida et al. | |
| 2012/0043553 A1* | 2/2012 | Lidow et al. | 257/76 |

FOREIGN PATENT DOCUMENTS

| | | |
|---|---|---|
| JP | 2001-168111 | 6/2001 |
| JP | 2006351691 A | 12/2006 |
| JP | 2007208037 A | 8/2007 |
| JP | 2008-243943 | 10/2008 |
| JP | 2009054807 A | 3/2009 |

OTHER PUBLICATIONS

Japanese Office Acton dated Oct. 29, 2013, filed in Japanese counterpart Application No. 2011-198301, 4 pages (with translation).
Japanese Office Action dated May 15, 2014, filed in Japanese counterpart Application No. 2011-198301, 4 pages (with translation).

* cited by examiner

*Primary Examiner* — Steven J Fulk
(74) *Attorney, Agent, or Firm* — Patterson & Sheridan, LLP

(57) ABSTRACT

A nitride semiconductor device includes a first semiconductor layer, a second semiconductor layer, a conductive substrate, a first electrode, a second electrode, and a control electrode. The second semiconductor layer is directly bonded to the first semiconductor layer. The conductive substrate is provided on and electrically connected to the first semiconductor layer. The first electrode and the second electrode are provided on and electrically connected to a surface of the second semiconductor layer on a side opposite to the first semiconductor layer. The control electrode is provided on the surface of the second semiconductor layer between the first electrode and the second electrode. The first electrode is electrically connected to a drain electrode of a MOSFET formed of Si. The control electrode is electrically connected to a source electrode of the MOSFET. The conductive substrate is electrically connected to a gate electrode of the MOSFET.

9 Claims, 4 Drawing Sheets

NITRIDE SEMICONDUCTOR DEVICE

CROSS-REFERENCE TO RELATED APPLICATION

This application is based upon and claims the benefit of priority from the prior Japanese Patent Application No. 2011-198301, filed on Sep. 12, 2011; the entire contents of which are incorporated herein by reference.

FIELD

Embodiments described herein relate generally to a nitride semiconductor device.

BACKGROUND

Power semiconductor devices are used as switching devices such as switching power supplies, inverters, etc. A high breakdown voltage and a low on-resistance are necessary in power semiconductor devices. The relationship between the breakdown voltage and the on-resistance is a trade-off relationship determined by the element material. In power semiconductor devices formed of Si, reductions of the on-resistance have reached the limits of the material. To further reduce the on-resistance, it is necessary to form the power semiconductor device of a material other than Si. As one such method, a HFET (Hetero-junction Field Effect Transistor) is formed of a nitride semiconductor of AlGaN and the like.

HFETs are field effect transistors in which a two-dimensional electron gas that forms at the heterojunction of AlGaN/GaN is used as the channel layer. Therefore, the mobility of the carriers is high. The two-dimensional electron gas is formed with a high concentration due to the piezoelectric polarization of the AlGaN layer occurring due to the lattice mismatch of the heterojunction. Further, the breakdown voltage of nitride semiconductors is high because the bandgaps are wide. As a result, a HFET formed of a nitride semiconductor (hereinbelow referred to as a GaN-HFET) has a better trade-off relationship between the breakdown voltage and the on-resistance, a lower on-resistance, and a higher breakdown voltage compared to a semiconductor device formed of Si.

However, the GaN-HFET is unfortunately a normally-on semiconductor device because the channel is continuously formed due to the piezoelectric polarization. Generally, it is necessary for a power semiconductor device used in a power apparatus such as a power supply, an inverter, etc., to be a normally-off semiconductor device to ensure the safety of the power apparatus. Therefore, a nitride semiconductor device that includes a GaN-HFET is artificially configured to be normally-off by the GaN-HFET having a cascode connection with a normally-off MOSFET formed of Si. Because the gate-drain capacitance is small in such a nitride semiconductor device that is artificially configured to be normally-off, noise due to the switching occurs easily. A normally-off nitride semiconductor device is desired in which the occurrence of noise due to the switching can be suppressed.

DETAILED DESCRIPTION

Figure 1:
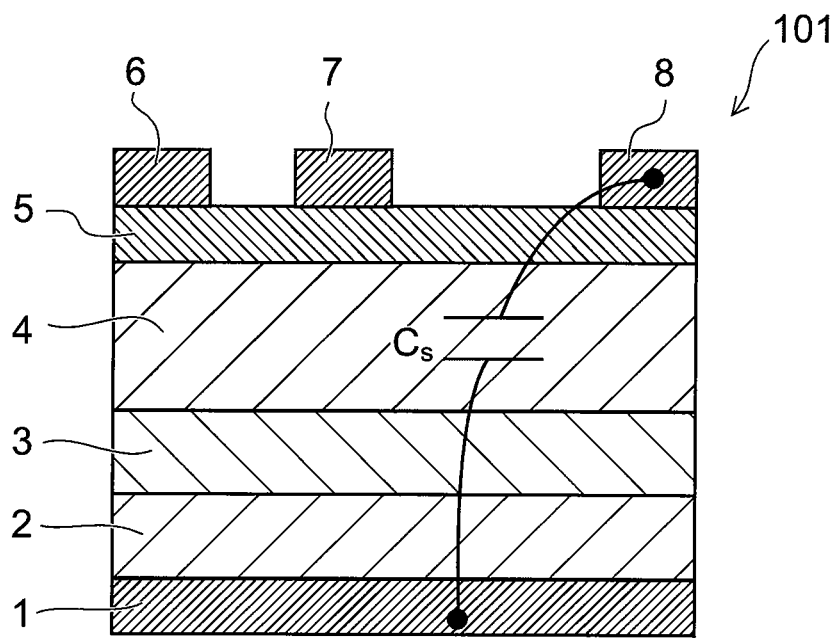
FIG. 1 is a schematic cross-sectional view of a portion of the nitride semiconductor device according to the first embodiment.

A nitride semiconductor device includes a first semiconductor layer, a second semiconductor layer, a conductive substrate, a first electrode, a second electrode, a control electrode, a back surface electrode, a first terminal, a second terminal, and a third terminal. The first semiconductor layer has a first surface and a second surface on a side opposite to the first surface. The first semiconductor layer is made of non-doped $Al_xGa_{1-x}N$ ($0 \le x < 1$). The second semiconductor layer is directly bonded to the first surface. The second semiconductor layer is made of non-doped or n-type $Al_yGa_{1-y}N$ ($0 < y \le 1$ and $x < y$). The conductive substrate is provided on the second surface side of the first semiconductor layer to be electrically connected to the first semiconductor layer. The first electrode is provided to be electrically connected to a surface of the second semiconductor layer on a side opposite to the first semiconductor layer. The second electrode is provided to be electrically connected to the surface of the second semiconductor layer. The control electrode is provided on the surface of the second semiconductor layer between the first electrode and the second electrode. The back surface electrode is electrically connected to a surface of the conductive substrate on a side opposite to the first semiconductor layer. The first electrode is electrically connected to a drain electrode of a MOSFET formed of Si. The control electrode is electrically connected to a source electrode of the MOSFET. The conductive substrate has a p conductivity type and is electrically connected to a gate electrode of the MOSFET via the back surface electrode. The first terminal is electrically connected to the second electrode. The second terminal is electrically connected to the gate electrode of the MOSFET. The third terminal is electrically connected to the source electrode of the MOSFET.

Embodiments of the invention will now be described with reference to the drawings. The drawings used in the description of the examples are schematic for ease of description. In the actual implementation, the configurations, the dimensions, the size relationships, and the like of the components of the drawings are not always as illustrated in the drawings and are modifiable as appropriate within ranges in which the effects of the invention are obtainable.

First Embodiment

Figure 2:
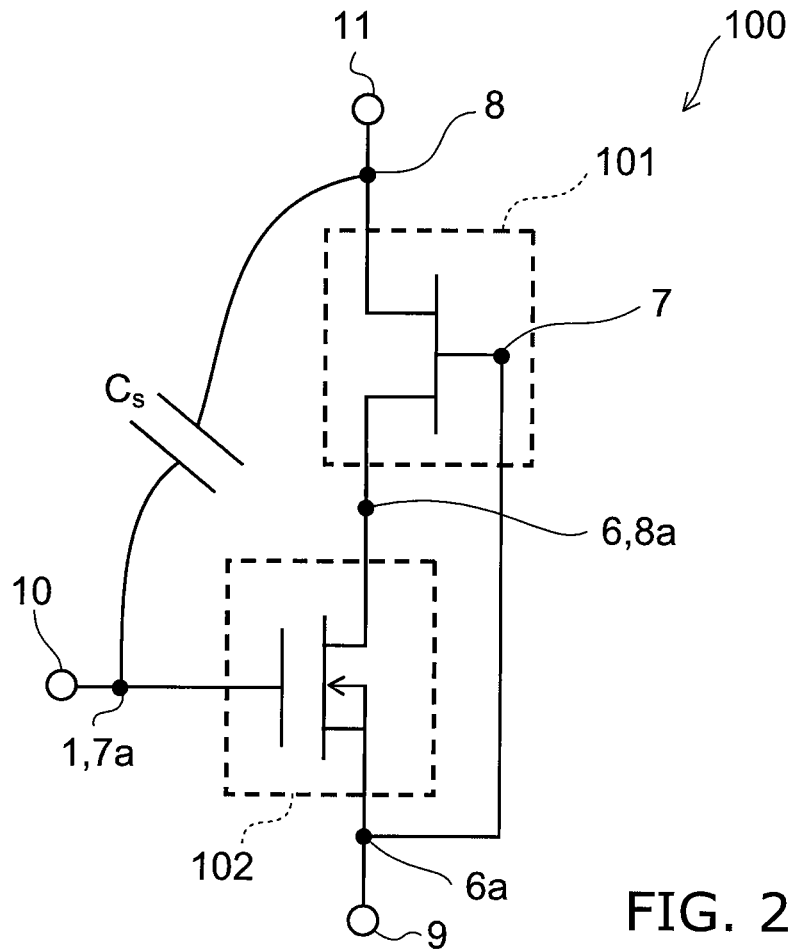
FIG. 2 is an equivalent circuit of the main components of the nitride semiconductor device according to the first embodiment.

A nitride semiconductor device according to a first embodiment will now be described using FIG. 1 and FIG. 2. FIG. 1 is a schematic cross-sectional view of a portion of the nitride semiconductor device 100 according to this embodiment. FIG. 2 is an equivalent circuit of the main components of the nitride semiconductor device 100 according to this embodiment. A GaN-HFET 101 illustrated in FIG. 1 is included as a portion of the nitride semiconductor device according to this embodiment. The GaN-HFET 101 includes a GaN channel layer 4 (a first semiconductor layer), an AlGaN barrier layer 5 (a second semiconductor layer), an AlGaN buffer layer 3, a p-type Si substrate 2 (a conductive substrate), a source electrode 6 (a first electrode), a drain electrode 8 (a second electrode), and a gate electrode 7 (a control electrode).

The GaN channel layer 4 has a first surface and a second surface on the side opposite to the first surface and is formed to be non-doped. The channel layer 4 is not limited to GaN and may be a nitride semiconductor layer having the compositional formula $Al_xGa_{1-x}N$ (0≤x<1). In this embodiment, GaN is described as an example.

The AlGaN barrier layer 5 is provided to be directly bonded to the first surface of the GaN channel layer 4 and is formed to be non-doped or doped with the n type. The AlGaN barrier layer 5 may be a nitride semiconductor layer having the compositional formula $Al_yGa_{1-y}N$ (0<$y_{1-y}$N and x<y) and is a nitride semiconductor layer having an Al composition ratio that is higher than that of the channel layer 4. The bandgap of the AlGaN barrier layer 5 is wider than that of the GaN channel layer 4. The AlGaN barrier layer 5 and the GaN channel layer 4 form a heterojunction.

The p-type Si substrate 2 is provided on the second surface side of the GaN channel layer 4 with the AlGaN buffer layer 3 interposed and is electrically connected to the GaN channel layer 4. The AlGaN buffer layer 3 is formed to be non-doped or doped with the p type. The AlGaN buffer layer 3 is not limited to a mixed crystal of AlN and GaN and may have a stacked structure in which AlN and GaN are repeatedly stacked. The p-type Si substrate 2 is not limited to Si and may be another conductive semiconductor substrate of SiC and the like.

The source electrode 6 is provided to be electrically connected to the surface of the AlGaN barrier layer 5 on the side opposite to the GaN channel layer. The drain electrode 8 is provided to be electrically connected to the surface of the AlGaN barrier layer 5 recited above. The source electrode 6 and the drain electrode 8 are formed to extend in stripe configurations along a first direction parallel to the first surface of the GaN channel layer 4 (a direction perpendicular to the page surface in the drawings); and the source electrode 6 and the drain electrode 8 have ohmic contacts with the AlGaN barrier layer 5.

The gate electrode 7 is provided on the surface of the AlGaN barrier layer 5 described above between the source electrode 6 and the drain electrode 8. Similarly to the source electrode 6 and the drain electrode 8, the gate electrode 7 is formed to extend in a stripe configuration along the first direction described above. The gate electrode 7 directly contacts the AlGaN barrier layer 5 in Schottky contact.

Instead of the gate electrode 7 having the Schottky contact with the AlGaN barrier layer 5, it is also possible to form the gate electrode 7 on the AlGaN barrier layer 5 with a gate insulating film interposed. In either case, the current flowing between the source electrode 6 and the drain electrode 8 can be controlled by adjusting the two-dimensional electron gas concentration formed at the interface between the AlGaN barrier layer 5 and the GaN channel layer 4 directly under the gate electrode 7 by applying a voltage to the gate electrode 7.

A back surface electrode 1 is electrically connected to the surface of the p-type Si substrate 2 on the side opposite to the GaN channel layer 4 and has an ohmic contact with the p-type Si substrate.

In the GaN-HFET 101, a high-concentration two-dimensional electron gas is formed at the interface between the AlGaN barrier layer 5 and the GaN channel layer 4 due to the piezoelectric effect of the AlGaN barrier layer 5. Even in the state in which the gate voltage is not applied, the two-dimensional electron gas forms a channel layer electrically connecting the source electrode 6 to the drain electrode 8; and the GaN-HFET 101 is in the on-state. In other words, the GaN-HFET 101 is a normally-on semiconductor device.

The GaN-HFET 101 has a stacked structure of the p-type Si substrate 2 and the AlGaN barrier layer 5. Even when formed to be non-doped, the AlGaN barrier layer 5 is an n-type semiconductor having high resistance. Therefore, in the GaN-HFET 101, a p-n junction is formed in the stacking direction; and a parasitic capacitance $C_S$ is caused by the p-n junction. The electrostatic capacitance $C_S$ may have a prescribed amount by adjusting the thicknesses and the impurity concentrations of the AlGaN buffer layer 3 and the GaN channel layer 4, the surface areas of the drain electrode 8 and the back surface electrode 1, and the like.

It is desirable for a semiconductor device for power electronics to be normally-off. Therefore, as illustrated in FIG. 2, the GaN-HFET 101 is provided with a cascode connection to a normally-off MOSFET 102 formed of Si (hereinbelow called a Si-MOSFET) to artificially obtain a normally-off nitride semiconductor device 100 using the GaN-HFET 101. The nitride semiconductor device 100 according to this embodiment includes the GaN-HFET 101, the Si-MOSFET 102, a source terminal 9 (a third terminal), a gate terminal 10 (a second terminal), and a drain terminal 11 (a first terminal). The Si-MOSFET 102 may be an existing normally-off MOSFET; and a detailed description is omitted.

The source electrode 6 of the GaN-HFET 101 is electrically connected to a drain electrode 8a of the Si-MOSFET 102. The gate electrode 7 of the GaN-HFET 101 is electrically connected to the source electrode of the Si-MOSFET 102. Thus, the GaN-HFET 101 and the Si-MOSFET 102 have a cascode connection.

The drain terminal 11 is electrically connected to the drain electrode 8 of the GaN-HFET 101. The gate terminal 10 is electrically connected to a gate electrode 7a of the Si-MOSFET 102. The source terminal 9 is electrically connected to a source electrode 6a of the Si-MOSFET 102.

The back surface electrode 1 of the GaN-HFET 101 is electrically connected to the gate electrode 7a of the Si-MOSFET 102. Thereby, the p-type Si substrate 2 inside the GaN-HFET 101 is electrically connected to the gate electrode 7a of the Si-MOSFET 102 via the back surface electrode 1. As a result, the parasitic capacitance $C_S$ of the GaN-HFET 101 is provided between the gate terminal 10 and the drain terminal 11 of the nitride semiconductor device 100 according to this embodiment; and the parasitic capacitance $C_S$ becomes a gate-drain capacitance $C_{GD}$ of the nitride semiconductor device 100.

Operations of the nitride semiconductor device 100 according to this embodiment will now be described. In the case where a voltage that is positive with respect to the source terminal 9 is applied to the drain terminal 11 in the state in which the voltage of the gate terminal 10 with respect to the source terminal 9 is zero or negative, the voltage between the drain terminal 11 and the source terminal 9 is applied between the drain electrode 8a and the source electrode 6a of the Si-MOSFET 102 because the Si-MOSFET 102 is normally-off. Therefore, the GaN-HFET 101 is switched to the off-state because a voltage that is negative with respect to the source electrode 6 is applied to the gate electrode 7 of the GaN- HFET 101. As a result, the nitride semiconductor device 100 is switched to the off-state between the drain terminal 11 and the source terminal 9.

Then, when a voltage that is positive with respect to the source terminal 9 is applied to the gate terminal 10, the Si-MOSFET 102 is switched to the on-state; and the source electrode 6 and the gate electrode 7 of the GaN-HFET 101 have the same potential. As a result, the GaN-HFET 101 is switched to the on-state because the GaN-HFET 101 is normally-on; and the nitride semiconductor device 100 is switched to the on-state between the drain terminal 11 and the source terminal 9. As a result, the nitride semiconductor device 100 has a normally-off operation in which the nitride semiconductor device 100 is switched to the off-state in the state in which a voltage that is positive with respect to the source terminal 9 is not applied to the gate terminal 10, and the nitride semiconductor device 100 is switched to the on-state when a positive voltage is applied.

Although the nitride semiconductor device 100 has a normally-off operation, the parasitic capacitance between the gate terminal 10 and the drain terminal 11 due to only the cascode connection between the GaN-HFET 101 and the Si-MOSFET is small because a parasitic p-n junction does not exist directly between the gate terminal 10 and the drain terminal 11. However, in the nitride semiconductor device 100 according to this embodiment as described above, the back surface electrode 1 of the GaN-HFET 101 is electrically connected to the gate electrode 7a of the Si-MOSFET 102. In other words, the p-type Si substrate 2 of the GaN-HFET 101 is electrically connected to the gate electrode 7a of the Si-MOSFET 102. Therefore, in the nitride semiconductor device 100 as illustrated in FIG. 2, the parasitic capacitance $C_S$ due to the p-n junction inside the GaN-HFET 101 is included directly between the gate terminal 10 and the drain terminal 11.

The parasitic capacitance $C_S$ becomes the gate-drain capacitance $C_{GD}$ of the nitride semiconductor device 100. Because the charging and discharging of the parasitic capacitance $C_S$ can be controlled by an external gate resistance, the occurrence of noise due to the switching in the nitride semiconductor device 100 according to this embodiment can be suppressed. Thus, according to this embodiment, a normally-off nitride semiconductor device in which the occurrence of switching noise is suppressed can be provided.

By forming the AlGaN buffer layer 3 and the GaN channel layer 4 to be non-doped, the amount of the electrostatic capacitance $C_S$ does not depend on the applied voltage and can be substantially constant. Thereby, the voltage change dV/dt of the drain terminal 11 is constant without depending on the voltage; and the electrostatic capacitance $C_S$ is an ideal snubber capacitance. Thus, it is desirable for the AlGaN buffer layer 3 and the GaN channel layer 4 to be formed to be non-doped.

Second Embodiment

Figure 3:
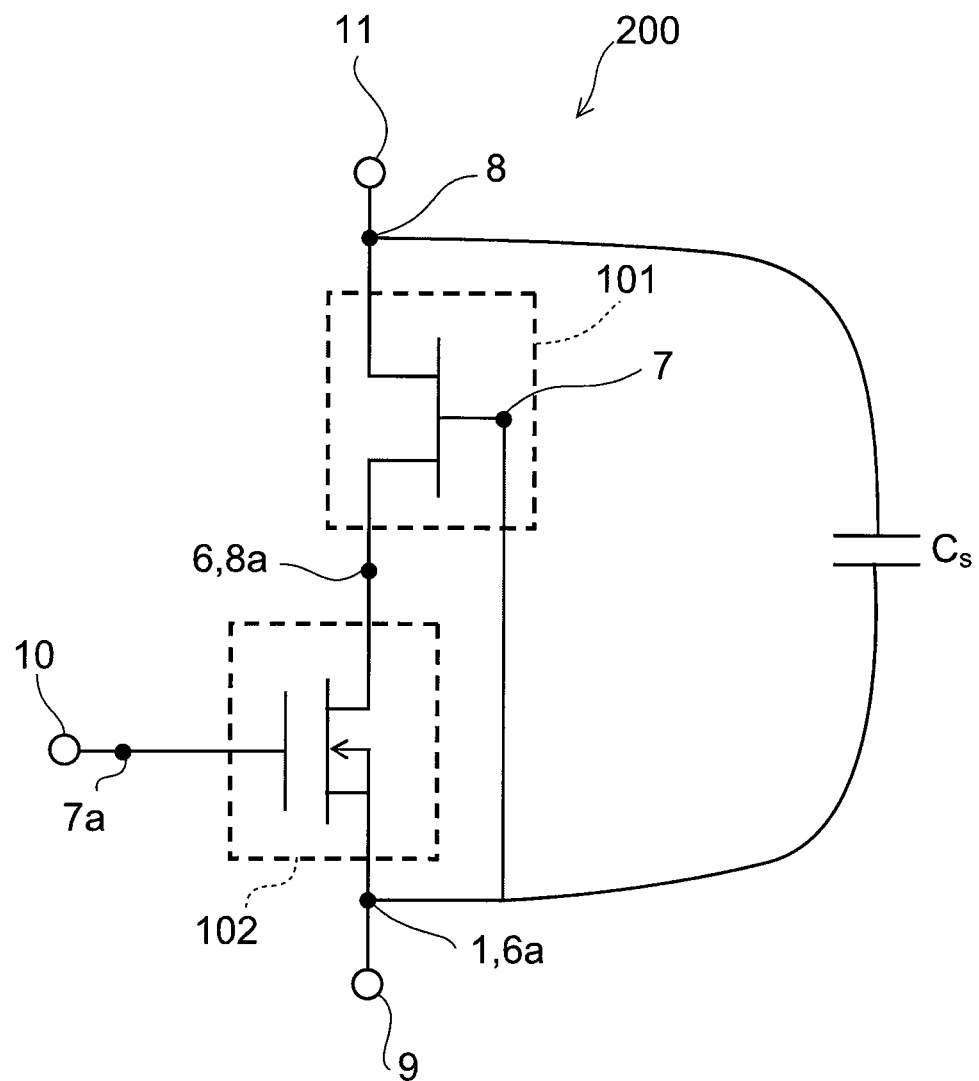
FIG. 3 is an equivalent circuit of the main components of the nitride semiconductor device according to the second embodiment.

A nitride semiconductor device according to a second embodiment will now be described using FIG. 3. FIG. 3 is an equivalent circuit of the main components of the nitride semiconductor device 200 according to this embodiment. The same reference numeral or symbol is used for portions having the same configurations as those described in the first embodiment, and a description of such portions is omitted. Points that differ from the first embodiment are mainly described.

Similarly to the nitride semiconductor device 100 according to the first embodiment, the GaN-HFET 101 illustrated in FIG. 1 is included as a portion of the nitride semiconductor device 200 according to this embodiment. In the nitride semiconductor device 200 as illustrated in FIG. 3, similarly to the nitride semiconductor device 100 according to the first embodiment, the GaN-HFET 101 is provided with a cascode connection to the normally-off Si-MOSFET 102. In other words, the nitride semiconductor device 100 according to this embodiment includes the GaN-HFET 101, the Si-MOSFET 102, the source terminal 9, the gate terminal 10, and the drain terminal 11.

The back surface electrode 1 of the GaN-HFET 101 is electrically connected to the source electrode 6a of the Si-MOSFET 102. On this point, the nitride semiconductor device 200 according to this embodiment differs from the nitride semiconductor device 100 according to the first embodiment. Thereby, the p-type Si substrate 2 inside the GaN-HFET 101 is electrically connected to the source electrode 6a of the Si-MOSFET 102 via the back surface electrode 1. As a result, the parasitic capacitance $C_S$ of the GaN-HFET 101 is provided between the source terminal 9 and the drain terminal 11 of the nitride semiconductor device 200 according to this embodiment; and the parasitic capacitance $C_S$ becomes a source-drain capacitance $C_{SD}$ of the nitride semiconductor device 200.

In the case of the cascode connection, the gate-source voltage of the GaN-HFET 101 corresponds to the source-drain voltage of the Si-MOSFET 102. In the case where the voltage change of the drain terminal 11 is determined by the source-drain capacitance of the GaN-HFET 101 being connected in series with the source-drain capacitance of the Si-MOSFET 102, the gate-source voltage of the GaN-HFET 101 also changes according to the voltage of the drain terminal 11. Therefore, the GaN-HFET 101 oscillates easily due to the effect of the parasitic inductance. That is, switching noise occurs easily in the nitride semiconductor device 200.

Conversely, in the structure illustrated in FIG. 3, the voltage change of the drain terminal 11 is determined by the electrostatic capacitance $C_S$. As a result, the source-drain voltage of the Si-MOSFET 102 and the gate-source voltage of the GaN-HFET 101 that is equivalent to the source-drain voltage of the Si-MOSFET 102 are stable. Therefore, the occurrence of switching noise is suppressed in the nitride semiconductor device 200 according to this embodiment.

Thus, according to the embodiment of the invention as well, a normally-off nitride semiconductor device in which the occurrence of switching noise is suppressed can be provided.

Third Embodiment

Figure 4:
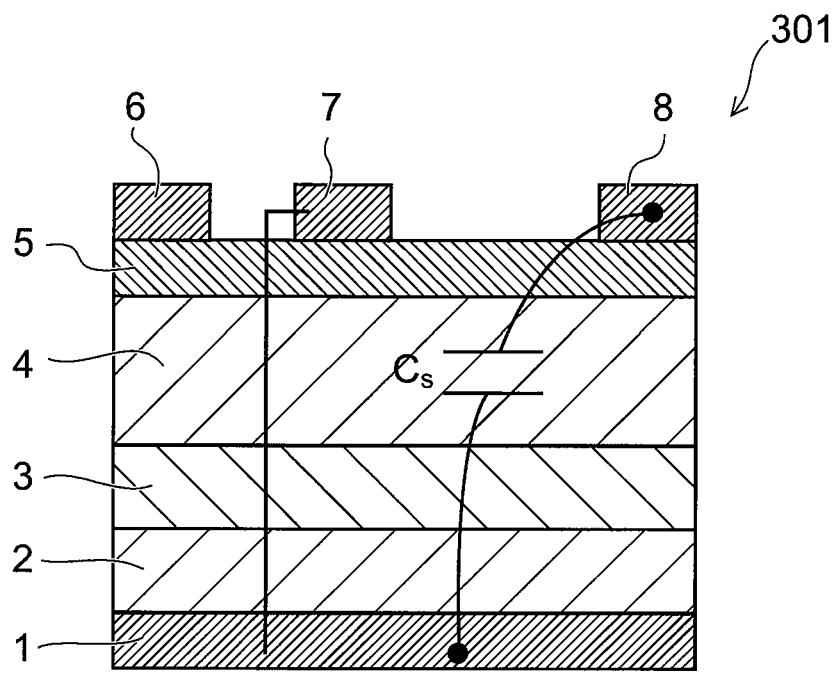
FIG. 4 is a schematic cross-sectional view of the main components of the nitride semiconductor device according to the third embodiment.

A nitride semiconductor device according to a third embodiment will now be described using FIG. 4. FIG. 4 is a schematic cross-sectional view of the main components of the nitride semiconductor device 300 according to this embodiment. The same reference numeral or symbol is used for portions having the same configurations as those described in the first embodiment, and a description of such portions is omitted. Points that differ from the first embodiment are mainly described.

The nitride semiconductor device 300 according to this embodiment includes a GaN-HFET 301 illustrated in FIG. 4. In the nitride semiconductor device 300 according to this embodiment, the GaN-HFET 301 is used solitarily without having a cascode connection with a Si-MOSFET. In the GaN-HFET 301, the gate electrode 7 is electrically connected to the back surface electrode 1. On the points recited above, the nitride semiconductor device 300 according to this embodiment differs from the nitride semiconductor device 100 according to the first embodiment, and the GaN-HFET 301 according to this embodiment differs from the GaN-HFET 101 according to the first embodiment.

In the nitride semiconductor device 300 according to this embodiment, the source electrode 6, the gate electrode 7, and the drain electrode 8 of the GaN-HFET 301 are connected to a not-illustrated source terminal, gate terminal, and drain terminal, respectively. Similarly to the GaN-HFET 101 according to the first embodiment, the GaN-HFET 301 according to this embodiment has a normally-on operation.

Because the gate electrode 7 is electrically connected to the back surface electrode 1, the GaN-HFET 301 according to this embodiment has the parasitic capacitance $C_S$ as the gate-drain capacitance $C_{GD}$ between the gate electrode 7 and the drain electrode 8. Accordingly, in the nitride semiconductor device 300 according to this embodiment, the occurrence of switching noise can be suppressed because the charging and discharging of the parasitic capacitance $C_S$ can be controlled by a gate resistance connected to the outside.

Because the gate electrode 7 is electrically connected to the back surface electrode 1, the back surface electrode 1 functions as a field plate for the gate electrode 7. As a result, the electric field spreads not only between the drain electrode 8 and the gate electrode 7 but also between the drain electrode 8 and the back surface electrode 1. Because the electric field no longer concentrates at the end portion of the gate electrode 7 on the drain electrode side, the current collapse phenomenon is suppressed.

Similarly to the first embodiment, in the case of the solitary GaN-HFET as well, the amount of the electrostatic capacitance $C_S$ does not depend on the applied voltage and can be substantially constant by forming the AlGaN buffer layer 3 and the GaN channel layer 4 to be non-doped. Thereby, the voltage change dV/dt of the drain terminal 11 is constant without depending on the voltage; and the electrostatic capacitance $C_S$ is an ideal snubber capacitance. Thus, it is desirable for the AlGaN buffer layer 3 and the GaN channel layer 4 to be formed to be non-doped.

In this embodiment, the case is described where the GaN-HFET 301 is used solitarily without having a cascode connection with a Si-MOSFET. However, similarly to the first embodiment, it is also possible to artificially provide a normally-off nitride semiconductor device by using a GaN-HFET 301 that has a cascode connection with a Si-MOSFET as illustrated in FIG. 2 or FIG. 3. However, in such a case, it is unnecessary for the back surface electrode 1 of the GaN-HFET 301 to be electrically connected separately to the gate electrode 7a or the source electrode 6a of the Si-MOSFET as in FIG. 2 or FIG. 3.

Fourth Embodiment

Figure 5:
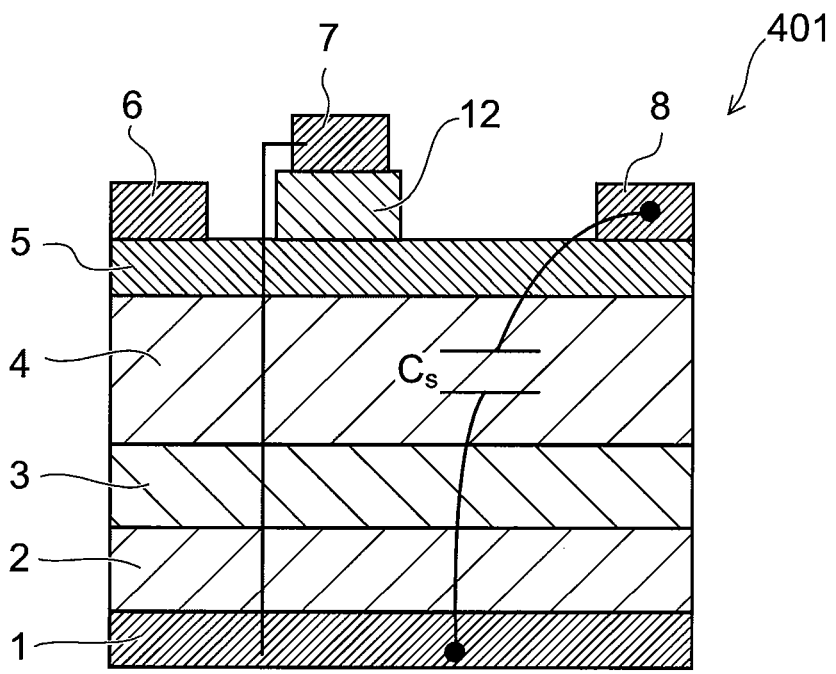
FIG. 5 is a schematic cross-sectional view of the main components of the nitride semiconductor device according to the fourth embodiment.

A nitride semiconductor device according to a fourth embodiment will now be described using FIG. 5. FIG. 5 is a schematic cross-sectional view of the main components of the nitride semiconductor device 400 according to this embodiment. The same reference numeral or symbol is used for portions having the same configurations as those described in the third embodiment, and a description of such portions is omitted. Points that differ from the third embodiment are mainly described.

The nitride semiconductor device 400 according to this embodiment includes a GaN-HFET 401 illustrated in FIG. 5. Similarly to the third embodiment, the GaN-HFET 401 is used solitarily without having a cascode connection with a Si-MOSFET in the nitride semiconductor device 400 according to this embodiment.

However, the GaN-HFET 401 according to this embodiment includes a p-GaN layer 12 between the gate electrode 7 and the AlGaN barrier layer 5. The p-GaN layer 12 is electrically connected to both the gate electrode 7 and the AlGaN barrier layer 5. On this point, the GaN-HFET 401 according to this embodiment differs from the GaN-HFET 301 according to the third embodiment, and the nitride semiconductor device 400 according to this embodiment differs from the nitride semiconductor device 300 according to the third embodiment.

In the GaN-HFET 401 according to this embodiment, a depletion layer spreads into the AlGaN barrier layer 5 due to the p-n junction between the p-GaN layer 12 and the AlGaN barrier layer 5. As a result, the electric field due to the piezoelectric polarization is canceled and a built-in potential occurs due to the p-type doping at the portion of the AlGaN barrier layer 5 directly under the p-GaN layer 12. Thereby, the two-dimensional electron gas that was formed at the interface between the AlGaN barrier layer 5 and the GaN channel layer 4 is lost at the portion directly under the gate electrode 7. In other words, the GaN-HFET 401 according to this embodiment has a normally-off operation, because the channel connecting the source electrode 6 to the drain electrode 8 is broken directly under the gate electrode 7 in the state in which a voltage that is positive with respect to the source electrode 6 is not applied to the gate electrode 7.

This embodiment is described using the p-GaN layer 12. However, the GaN-HFET 401 similarly has a normally-off operation even when using a p-AlGaN layer or a p-InGaN layer instead of the p-GaN layer.

Similarly to the GaN-HFET 301 according to the third embodiment, the gate electrode 7 is electrically connected to the back surface electrode 1 in the GaN-HFET 401 according to this embodiment. Therefore, the GaN-HFET 401 according to this embodiment has the parasitic capacitance $C_S$ as the gate-drain capacitance $C_{GD}$ between the gate electrode 7 and the drain electrode 8. Accordingly, in the nitride semiconductor device 400 according to this embodiment, the occurrence of switching noise can be suppressed because the charging and discharging of the parasitic capacitance $C_S$ can be controlled by a gate resistance connected to the outside.

Because the gate electrode 7 is electrically connected to the back surface electrode 1, the back surface electrode 1 functions as a field plate for the gate electrode 7. As a result, the electric field spreads not only between the drain electrode 8 and the gate electrode 7 but also between the drain electrode 8 and the back surface electrode 1. Because the electric field no longer concentrates at the end portion of the gate electrode 7 on the drain electrode side, the current collapse phenomenon is suppressed.

Similarly to the first embodiment, in the case of the solitary GaN-HFET as well, the amount of the electrostatic capacitance $C_S$ does not depend on the applied voltage and can be substantially constant by forming the AlGaN buffer layer 3 and the GaN channel layer 4 to be non-doped. Thereby, the voltage change dV/dt of the drain terminal 11 is constant without depending on the voltage; and the electrostatic capacitance $C_S$ is an ideal snubber capacitance. Thus, it is desirable for the AlGaN buffer layer 3 and the GaN channel layer 4 to be formed to be non-doped.

Thus, according to this embodiment, a normally-off nitride semiconductor device in which the occurrence of switching noise is suppressed can be provided.

Fifth Embodiment

Figure 6:
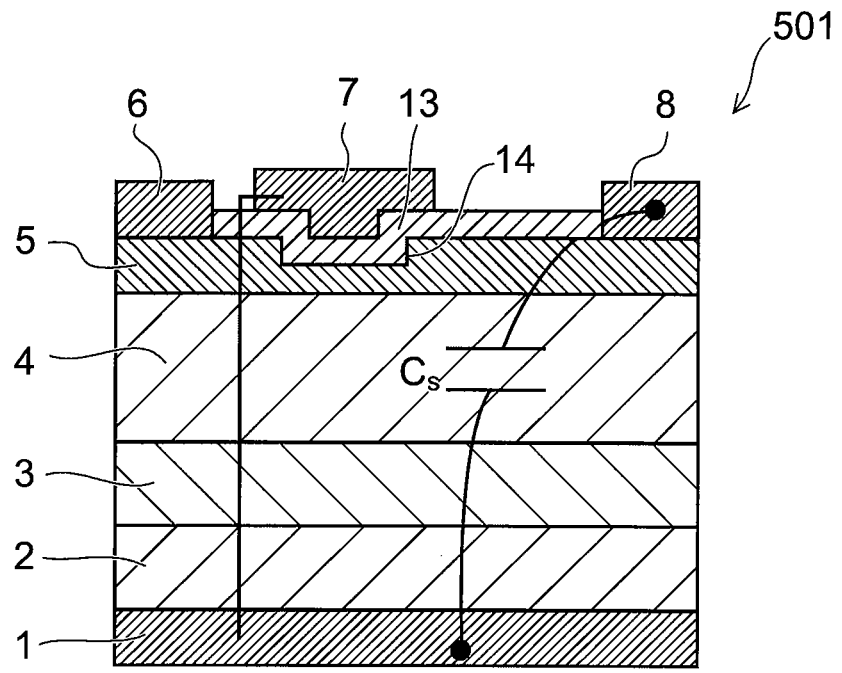
FIG. 6 is a schematic cross-sectional view of the main components of the nitride semiconductor device according to the fifth embodiment.

A semiconductor device according to a fifth embodiment will now be described using FIG. 6. FIG. 6 is a schematic cross-sectional view of the main components of the nitride semiconductor device 500 according to this embodiment. The same reference numeral or symbol is used for portions having the same configurations as those described in the fourth embodiment, and a description of such portions is omitted. Points that differ from the fourth embodiment are mainly described.

The nitride semiconductor device 500 according to this embodiment includes a GaN-HFET 501 illustrated in FIG. 6. Similarly to the fourth embodiment, the GaN-HFET 501 is used solitarily without having a cascode connection with a Si-MOSFET in the nitride semiconductor device 500 according to this embodiment.

However, the GaN-HFET 501 according to this embodiment includes a gate insulating film 13 between the gate electrode 7 and the AlGaN barrier layer 5. Further, in the GaN-HFET 501, the AlGaN barrier layer 5 is formed such that the thickness of the portion of the AlGaN barrier layer 5 directly under the gate electrode 7 is thinner in the stacking direction (the direction perpendicular to the first surface of the GaN barrier layer) than is the portion where the gate electrode 7 does not exist. Restated, the AlGaN barrier layer 5 has a recess toward the interior of the AlGaN barrier layer 5 from the surface of the AlGaN barrier layer 5 on the side opposite to the GaN channel layer 4; and the gate electrode 7 is formed inside this recess with the gate insulating film 13 interposed. The gate electrode 7 is insulated from the AlGaN barrier layer 5 by the gate insulating film 13. On this point, the GaN-HFET 501 according to this embodiment differs from the GaN-HFET 401 according to the fourth embodiment, and the nitride semiconductor device 500 according to this embodiment differs from the nitride semiconductor device 400 according to the fourth embodiment.

In the GaN-HFET 501 according to this embodiment, the thickness of the AlGaN barrier layer 5 directly under the gate electrode 7 is thinner than the portion where the gate electrode 7 is not formed. As the thickness of the AlGaN barrier layer 5 decreases, the piezoelectric polarization becomes weak because the amount of strain due to the lattice mismatch of the AlGaN/GaN is low. The thickness of the portion directly under the gate electrode 7 of the AlGaN barrier layer 5 is formed to be thin enough that the two-dimensional electron gas due to the piezoelectric polarization substantially is not formed. Therefore, the GaN-HFET 501 according to this embodiment has a normally-off operation, because the channel connecting the source electrode 6 to the drain electrode 8 is broken directly under the gate electrode 7 in the state in which a voltage that is positive with respect to the source electrode is not applied to the gate electrode. Similarly to the GaN-HFET 401 according to the fourth embodiment, the gate electrode 7 is electrically connected to the back surface electrode 1 in the GaN-HFET 501 according to this embodiment. Therefore, the GaN-HFET 501 according to this embodiment has the parasitic capacitance $C_S$ as the gate-drain capacitance $C_{GD}$ between the gate electrode 7 and the drain electrode 8. Accordingly, in the nitride semiconductor device 500 according to this embodiment, the occurrence of switching noise can be suppressed because the charging and discharging of the parasitic capacitance $C_S$ can be controlled by a gate resistance connected to the outside.

Because the gate electrode 7 is electrically connected to the back surface electrode 1, the back surface electrode 1 functions as a field plate for the gate electrode 7. As a result, the electric field spreads not only between the drain electrode 8 and the gate electrode 7 but also between the drain electrode 8 and the back surface electrode 1. Because the electric field no longer concentrates at the end portion of the gate electrode 7 on the drain electrode side, the current collapse phenomenon is suppressed.

Similarly to the first embodiment, in the case of the solitary GaN-HFET as well, the amount of the electrostatic capacitance $C_S$ does not depend on the applied voltage and is substantially constant by forming the AlGaN buffer layer 3 and the GaN channel layer 4 to be non-doped. Thereby, the voltage change dV/dt of the drain terminal 11 is constant without depending on the voltage; and the electrostatic capacitance $C_S$ is an ideal snubber capacitance. Thus, it is desirable for the AlGaN buffer layer 3 and the GaN channel layer 4 to be formed to be non-doped.

Thus, according to this embodiment, a normally-off nitride semiconductor device in which the occurrence of switching noise is suppressed can be provided.

Sixth Embodiment

Figure 7:
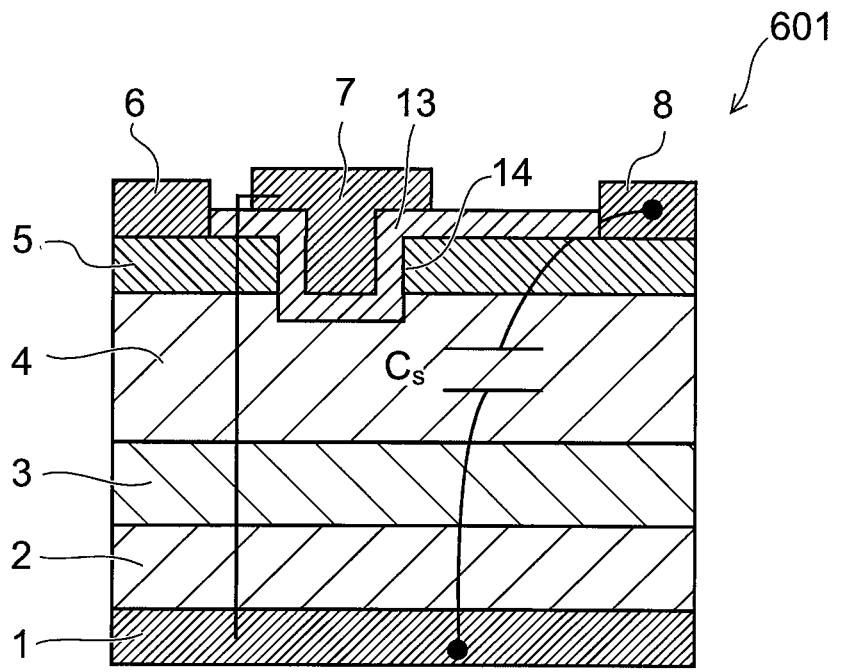
FIG. 7 is a schematic cross-sectional view of the main components of the nitride semiconductor device according to the sixth embodiment.

A semiconductor device according to a sixth embodiment will now be described using FIG. 7. FIG. 7 is a schematic cross-sectional view of the main components of the nitride semiconductor device 600 according to this embodiment. The same reference numeral or symbol is used for portions having the same configurations as those described in the fifth embodiment, and a description of such portions is omitted. Points that differ from the fifth embodiment are mainly described.

The nitride semiconductor device 600 according to this embodiment includes a GaN-HFET 601 illustrated in FIG. 7. Similarly to the fifth embodiment, the GaN-HFET 601 is used solitarily without having a cascode connection with a Si-MOSFET in the nitride semiconductor device 600 according to this embodiment.

However, the GaN-HFET 601 according to this embodiment includes the gate insulating film 13 between the gate electrode 7 and the AlGaN barrier layer 5. Further, in the GaN-HFET 601, the AlGaN barrier layer 5 does not exist at the portion of the AlGaN barrier layer 5 directly under the gate electrode 7 and has an opening that communicates with the GaN channel layer 4. Restated, the GaN-HFET 601 has a recess that pierces the AlGaN barrier layer 5 to reach the interior of the GaN channel layer from the surface of the AlGaN barrier layer 5 on the side opposite to the GaN channel layer 4; and the gate electrode 7 is formed inside this recess with the gate insulating film 13 interposed. The bottom of the recess is formed of the GaN channel layer 4. The gate electrode 7 is formed to oppose the GaN channel layer 4 via the gate insulating film 13. The gate electrode 7 is insulated from the AlGaN barrier layer 5 and the GaN channel layer 4 by the gate insulating film 13. On this point, the GaN-HFET 601 according to this embodiment differs from the GaN-HFET 501 according to the fifth embodiment, and the nitride semiconductor device 600 according to this embodiment differs from the nitride semiconductor device 500 according to the fifth embodiment.

In the GaN-HFET 601 according to this embodiment, the AlGaN barrier layer 5 does not exist directly under the gate electrode 7. In other words, the heterointerface of the AlGaN/GaN does not exist. Therefore, the two-dimensional electron gas due to the piezoelectric polarization of the AlGaN barrier layer 5 is not formed at the interface between the GaN channel layer 4 and the gate insulating film 13 directly under the gate electrode 7. As a result, the GaN-HFET 601 according to this embodiment has a normally-off operation, because the channel connecting the source electrode 6 to the drain electrode 8 is broken directly under the gate electrode 7 in the state in which a voltage that is positive with respect to the source electrode is not applied to the gate electrode.

Similarly to the GaN-HFET 501 according to the fifth embodiment, the gate electrode 7 is electrically connected to the back surface electrode 1 in the GaN-HFET 601 according to this embodiment. Therefore, the GaN-HFET 601 according to this embodiment has the parasitic capacitance $C_S$ as the gate-drain capacitance $C_{GD}$ between the gate electrode 7 and the drain electrode 8. Accordingly, in the nitride semiconductor device 600 according to this embodiment, the occurrence of switching noise can be suppressed because the charging and discharging of the parasitic capacitance $C_S$ can be controlled by a gate resistance connected to the outside.

Because the gate electrode 7 is electrically connected to the back surface electrode 1, the back surface electrode 1 functions as a field plate for the gate electrode 7. As a result, the electric field spreads not only between the drain electrode 8 and the gate electrode 7 but also between the drain electrode 8 and the back surface electrode 1. Because the electric field no longer concentrates at the end portion of the gate electrode 7 on the drain electrode side, the current collapse phenomenon is suppressed.

Similarly to the first embodiment, in the case of the solitary GaN-HFET as well, the amount of the electrostatic capacitance $C_S$ does not depend on the applied voltage and is substantially constant by forming the AlGaN buffer layer 3 and the GaN channel layer 4 to be non-doped. Thereby, the voltage change dV/dt of the drain terminal 11 is constant without depending on the voltage; and the electrostatic capacitance $C_S$ is an ideal snubber capacitance. Thus, it is desirable for the AlGaN buffer layer 3 and the GaN channel layer 4 to be formed to be non-doped.

Thus, according to this embodiment, a normally-off nitride semiconductor device in which the occurrence of switching noise is suppressed can be provided.

Hereinabove, examples are described in the embodiments of the invention in which AlGaN is used in the barrier layer and GaN is used in the channel layer. However, this is not limited thereto. The embodiments recited above are practicable also in the cases where GaN is used in the barrier layer and InGaN is used in the channel layer, where AlN is used in the barrier layer and AlGaN is used in the channel layer, or where InAlN is used in the barrier layer and GaN is used in the channel layer, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nitride semiconductor device, comprising:
a first semiconductor layer having a first surface and a second surface on a side opposite to the first surface, the first semiconductor layer including $Al_xGa_{1-x}N$ ($0 \leq x < 1$);
a second semiconductor layer bonded to the first surface, the second semiconductor layer including non-doped or n-type $Al_yGa_{1-y}N$ ($0 < y \leq 1$ and $x < y$);
a conductive substrate provided on the second surface side of the first semiconductor layer and electrically connected to the first semiconductor layer;
a first electrode electrically connected to a surface of the second semiconductor layer on a side opposite to the first semiconductor layer;
a second electrode provided electrically connected to the surface of the second semiconductor layer;
a control electrode provided on the surface of the second semiconductor layer between the first electrode and the second electrode;
a first terminal;
a second terminal; and
a third terminal,
the first electrode being electrically connected to a drain electrode of a MOSFET formed of Si,
the control electrode being electrically connected to a source electrode of the MOSFET,
the conductive substrate being electrically connected to a gate electrode of the MOSFET,
the first terminal electrically connected to the second electrode,
the second terminal electrically connected to the gate electrode of the MOSFET, and
the third terminal electrically connected to the source electrode of the MOSFET.

2. The device according to claim 1, further comprising a back surface electrode electrically connected to a surface of the conductive substrate on a side opposite to the first semiconductor layer,
the conductive substrate being electrically connected to the gate electrode of the MOSFET via the back surface electrode.

3. The device according to claim 1, wherein the conductive substrate has a p conductivity type.

4. The device according to claim 1, wherein a capacitance between the first terminal and the second terminal varies in accordance with an applied voltage on the second terminal.

5. A nitride semiconductor device, comprising:
a first semiconductor layer having a first surface and a second surface on a side opposite to the first surface, the first semiconductor layer including $Al_xGa_{1-x}N$ ($0 \leq x < 1$);
a second semiconductor layer bonded to the first surface, the second semiconductor layer including non-doped or n-type $Al_yGa_{1-y}N$ ($0 < y \leq 1$ and $x < y$);
a conductive substrate provided on the second surface side of the first semiconductor layer and electrically connected to the first semiconductor layer;
a first electrode electrically connected to a surface of the second semiconductor layer on a side opposite to the first semiconductor layer;
a second electrode electrically connected to the surface of the second semiconductor layer;
a control electrode provided on the surface of the second semiconductor layer between the first electrode and the second electrode;
a first terminal;
a second terminal; and
a third terminal,
the first electrode being electrically connected to a drain electrode of a MOSFET formed of Si,
the control electrode being electrically connected to a source electrode of the MOSFET,
the conductive substrate being electrically connected to the source electrode of the MOSFET,
the first terminal electrically connected to the second electrode, the second terminal electrically connected to the gate electrode of the MOSFET, and the third terminal electrically connected to the source electrode of the MOSFET.

6. The device according to claim 5, wherein the conductive substrate has a p conductivity type.

7. The device according to claim 5, wherein a capacitance between the first terminal and the third terminal varies in accordance with an applied voltage on the third terminal.

8. The device according to claim 5, further comprising:

a back surface electrode electrically connected to a surface of the conductive substrate on a side opposite to the first semiconductor layer, the conductive substrate being electrically connected to the source electrode of the MOSFET via the back surface electrode.

9. A nitride semiconductor device, comprising:

a first semiconductor layer having a first surface and a second surface on a side opposite to the first surface, the first semiconductor layer being made of non-doped $Al_xGa_{1-x}N$ ($0 \leq x < 1$);

a second semiconductor layer directly bonded to the first surface, the second semiconductor layer being made of non-doped or n-type $Al_xGa_{1-y}N$ ($0 < y \leq 1$ and $x < y$);

a conductive substrate provided on the second surface side of the first semiconductor layer to be electrically connected to the first semiconductor layer;

a first electrode provided to be electrically connected to a surface of the second semiconductor layer on a side opposite to the first semiconductor layer;

a second electrode provided to be electrically connected to the surface of the second semiconductor layer; and a control electrode provided on the surface of the second semiconductor layer between the first electrode and the second electrode, the first electrode being electrically connected to a drain electrode of a MOSFET formed of Si, the control electrode being electrically connected to a source electrode of the MOSFET, the conductive substrate being electrically connected to a gate electrode of the MOSFET, wherein the conductive substrate has a p conductivity type, and the control electrode is provided inside a recess with an insulating film interposed, the recess piercing the second semiconductor layer to expose the first semiconductor layer at the bottom of the recess.

* * * * *